US005566125A

United States Patent [19]

Fazio et al.

[11] Patent Number: 5,566,125
[45] Date of Patent: Oct. 15, 1996

[54] METHOD AND CIRCUITRY FOR STORING DISCRETE AMOUNTS OF CHARGE IN A SINGLE MEMORY ELEMENT

[75] Inventors: Albert Fazio, Los Gatos; Gregory E. Atwood, San Jose; James Q. Mi, Sunnyvale, all of Calif.

[73] Assignee: Intel Corporation, Santa Clara, Calif.

[21] Appl. No.: 422,066

[22] Filed: Mar. 31, 1995

Related U.S. Application Data

[62] Division of Ser. No. 185,187, Jan. 21, 1994, Pat. No. 5,440,505.
[51] Int. Cl.⁶ .......................... G11C 13/00; G11C 11/56
[52] U.S. Cl. ........................................ 365/45; 365/189.05
[58] Field of Search .......................... 365/45, 49, 189.01, 365/230.01, 189.02, 189.05, 230.04, 230.05, 230.06

[56] References Cited

U.S. PATENT DOCUMENTS

| | | | |
|---|---|---|---|
| 4,357,685 | 11/1982 | Daniele et al. | 365/189 |
| 4,388,702 | 6/1983 | Sheppard | 365/104 |
| 4,415,992 | 11/1983 | Adlhoch | 365/94 |
| 5,043,940 | 8/1991 | Harari | 365/168 |
| 5,095,344 | 3/1992 | Harari | 357/23.5 |
| 5,163,021 | 11/1992 | Mehrotra et al. | 365/185 |
| 5,172,338 | 12/1992 | Mehrotra et al. | 365/185 |
| 5,218,569 | 6/1993 | Banks | 365/189.01 |
| 5,220,531 | 6/1993 | Blyth et al. | 365/189.07 |
| 5,237,535 | 8/1991 | Mielke et al. | 365/218 |
| 5,388,064 | 2/1995 | Khan | 365/45 |
| 5,394,359 | 2/1995 | Kowalski | 365/185 |

FOREIGN PATENT DOCUMENTS

| | | |
|---|---|---|
| 0130614 | 7/1984 | European Pat. Off. |
| 0349775 | 1/1990 | European Pat. Off. |
| 0409697A1 | 7/1990 | European Pat. Off. |
| 2246022 | 9/1974 | France. |
| 56-60247 | 4/1981 | Japan. |
| 1486912 | 9/1977 | United Kingdom. |
| 9012400 | 4/1990 | WIPO. |
| 9212519 | 12/1991 | WIPO. |

OTHER PUBLICATIONS

PCT Search Report, 7 Nov. 1995, 5 pages.
PCT Search Report, May 22, 1995, 7 pages.

*Primary Examiner*—Terrell W. Fears
*Attorney, Agent, or Firm*—Blakely, Sokoloff, Taylor & Zafman

[57] ABSTRACT

A method and circuitry for programming a memory cell to one of at least three amounts of charge. The amount of charge placed in the memory cell is increased by increasing the voltage level of a programming pulse applied to the memory cell.

9 Claims, 11 Drawing Sheets

METHOD AND CIRCUITRY FOR STORING DISCRETE AMOUNTS OF CHARGE IN A SINGLE MEMORY ELEMENT

This is a divisional of application Ser. No. 08/185,187, filed Jan. 21, 1994, now U.S. Pat. No. 5,440,505.

FIELD OF THE INVENTION

The present invention relates to the programming of memory cells. More particularly, the present invention relates to a method and circuitry for programming flash memory cells to store discrete amounts of charge representing multiple bits of data in a single memory cell.

BACKGROUND

Nonvolatile semiconductor memories use a variety of semiconductor memory cell designs. One type of memory cell uses an electrically isolated floating gate to trap charge. A variety of mechanisms can be used to insert charge into the floating gate and to pull charge from it. Electron tunneling can be used both to inject charge and to pull charge off the floating gate of a memory cell. Hot electron injection is another mechanism for inserting charge into a floating gate of a memory cell. Other nonvolatile semiconductor memories use a trapping dielectric to insert or remove charge from between the control gate of a memory cell and silicon.

An attractive feature of nonvolatile semiconductor memories is their ability to retain data when powered off. Another attractive feature of nonvolatile semiconductor memories is their ability to store analog data. This permits storage of multiple bits of data in a single memory cell, which is sometimes called multistate storage.

There are prior patents that discuss multistate storage. U.S. Pat. No. 5,043,940 of Harrari for FLASH EEPROM MEMORY SYSTEMS HAVING MULTISTATE STORAGE CELLS ("Harrari") defines four states in terms of the threshold voltage $V_t$ of a split-channel memory cell. Using these four states, Harrari is able to store two bits of data per memory cell by applying multiple programming pulses to each memory cell.

U.S. Pat. No. 5,163,021 of Mehrota et al. for MULTISTATE EEPROM READ AND WRITE CIRCUITS AND TECHNIQUES ("Mehrota") describes multilevel programming of split-channel memory cells in greater detail. Like Harrari, Mehrota defines four states in terms of memory cell threshold voltage. Mehrota describes programming multiple memory cells in parallel. A program pulse is applied to a group of cells simultaneously. Each cell is then program verified and those cells that are properly programmed are protected from further programming. Program pulses are applied until all memory cells in the group are properly programmed. Mehrota discloses using the same voltage levels for each subsequent programming pulse.

SUMMARY AND OBJECTS OF THE INVENTION

An object of the present invention is to provide a method and circuitry for storing discrete amounts of charge in a memory cell within a reasonable time period.

Another object of the present invention is to provide a method and circuitry for rapidly programming memory cells to allow storage of multiple bits of data in a single memory cell.

Another object of the present invention is to provide a method of accurately programming memory cells to selected states, which represent patterns of multiple data bits.

These and other objects of the invention are met by a method and circuitry for programming a memory cell to one of at least three amounts of charge. The amount of charge placed in the memory cell is increased by increasing the voltage level of a programming pulse applied to the memory cell.

Other objects, features, and advantages of the present invention will be apparent from the accompanying drawings and the detailed description that follows.

BRIEF DESCRIPTION OF THE DRAWINGS

The present invention is illustrated by way of example and not limitation in the figures of the accompanying drawings in which like references indicate similar elements and in which.

DETAILED DESCRIPTION

Figure 1:
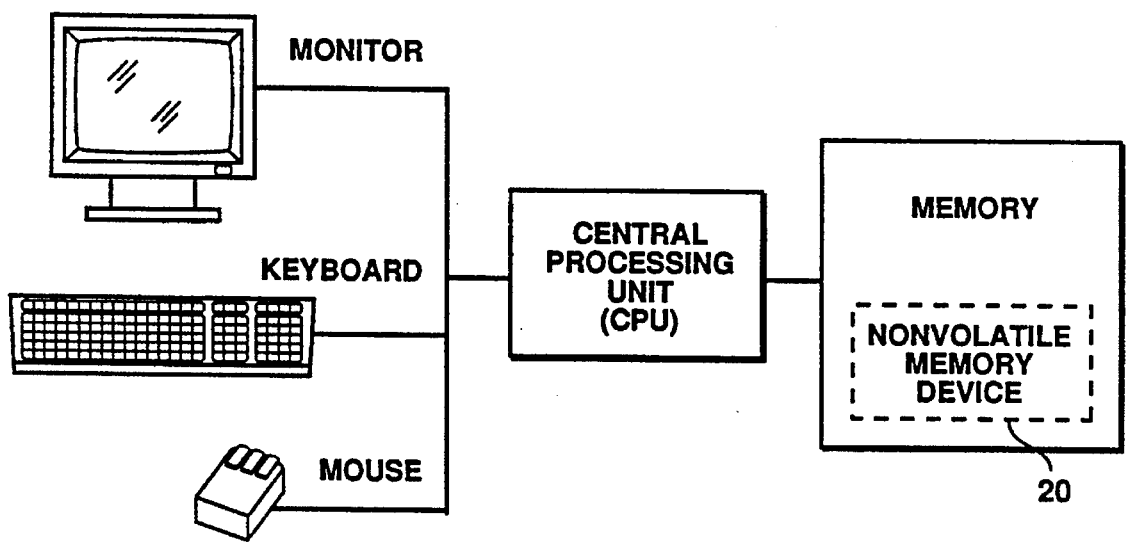
FIG. 1 is a block diagram of a personal computer.

FIG. 1 illustrates in block diagram form a computer system. The computer system includes a central processing unit ("CPU") and a monitor for visually displaying information to a computer user. A keyboard allows the computer user to input data to the CPU. By moving a mouse the computer user is able to move a pointer displayed on the monitor. Memory stores data used by the CPU. Nonvolatile semiconductor memory device 20 is one type of memory accessed by the CPU. Nonvolatile semiconductor memory 20 has the advantage of retaining data when powered off.

Figure 2:
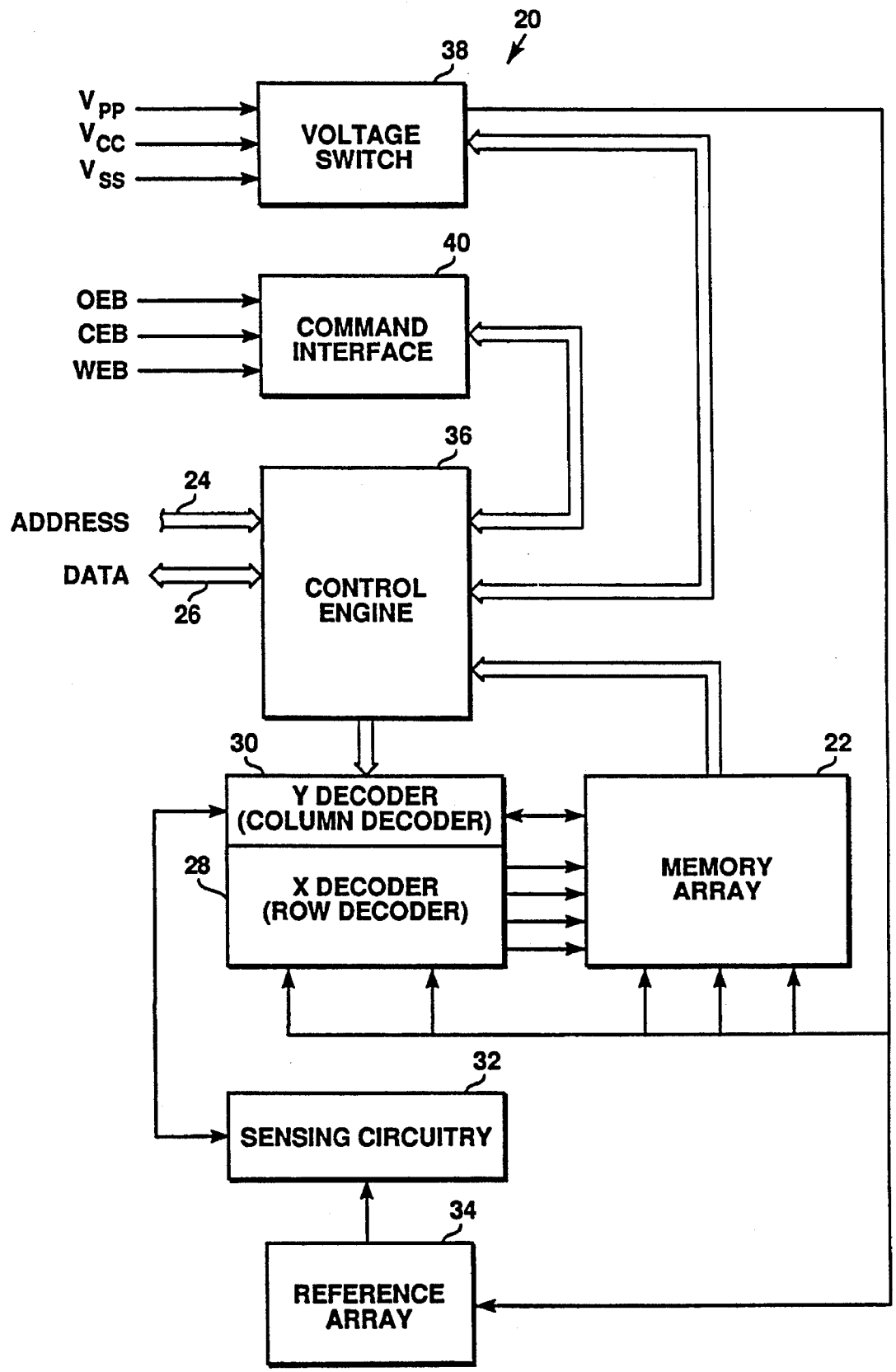
FIG. 2 is a block diagram of a memory device.

FIG. 2 illustrates in block diagram form nonvolatile memory device 20, which is fabricated on a single semiconductor substrate. Memory device 20 stores data using nonvolatile memory cells within memory array 22. The threshold voltages of the nonvolatile memory cells can be altered during programming, thus permitting storage of analog voltage levels. Memory array 22 may include any type of memory cell with programmable threshold voltages, such as memory cells with trapping dielectrics or floating gates. In one embodiment, memory array 22 is comprised of flash memory cells.

Methods of programming memory cells to store discrete amounts of charge will be described in more detail herein below. Briefly described, these methods use multiple programming pulses to place differing discrete amounts of charge within the memory cells. The amount of charge placed within each memory cell is varied by varying the gate or wordline voltage level during programming pulses. Placing differing discrete amounts of charge in each memory cell permits storage of multiple bits of data in a single memory cell. These methods are applicable to both nonvolatile memory cells, such as used in flash EPROMs, and volatile memory cells, such as used in dynamic random access memories (DRAMs).

I. Memory Device Overview

Prior to beginning that detailed discussion of programming, consider again memory device 20 to which the methods are applied. $V_{PP}$ is the erase/program power supply for memory device 20. In the absence of a high voltage level on the memory cells, memory device 20 acts as a read only memory. The data stored at an address indicated by address lines 24 is read from memory array 22 and is output to the external user via data lines 26.

X decoder 28 selects the appropriate row within memory array 22 in response to address signals applied to address lines 24. For this reason, X decoder 28 is also called row decoder 28. Similarly, Y decoder 30 selects the appropriate column within memory array 20 in response to address signals from address lines 24. Because of its function, Y decoder 30 is also called column decoder 30.

Data output from memory array 22 is coupled to Y decoder 30, which passes the data on to sensing circuitry 32. Sensing circuitry 32 determines the state of data presented to it using reference cell array 34. Sensing circuitry 32 then passes the results of its analysis back to Y decoder 30.

In an embodiment of memory device 20, control engine 36 controls the erasure and programming of memory array 22. Control engine 36 also controls the programming of multilevel cells, which will be described in detail herein below. In one embodiment, control engine 36 includes a processor, that is controlled by microcode stored in on-chip memory. However, the particular implementation of control engine 36 does not affect the present method of programming of multilevel cells.

Control engine 36 manages memory array 22 via control of row decoder 28, column decoder 30, sensing circuitry 32, reference cell array 34 and voltage switch 38. Voltage switch 38 controls the various voltage levels necessary to read, program and erase memory array 22. $V_{CC}$ is the device power supply and $V_{SS}$ is ground. $V_{PP}$ is the program/erase voltage, which must be high in order to program or erase data stored within memory array 22. $V_{PP}$ may be externally supplied or internally generated.

User commands for reading, erasure, and programming are communicated to control engine 36 via command interface 40. The external user issues commands to command interface 40 via three control pins: output enable OEB, write enable WEB, and chip enable CEB.

Figure 3:
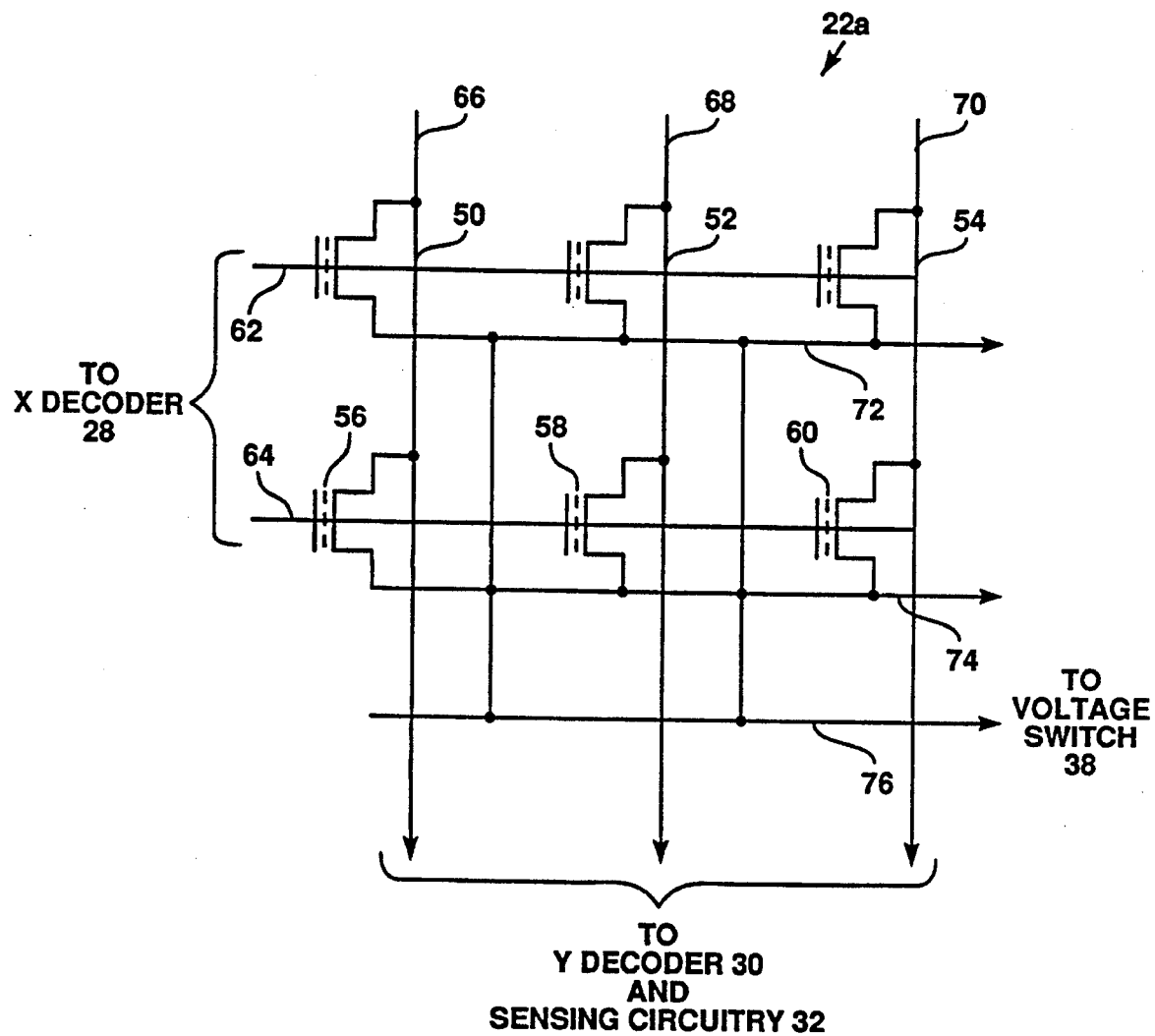
FIG. 3 is a schematic diagram of a portion of a memory array.

Programming memory cells according to the present methods requires some understanding of the organization of memory array 22. FIG. 3 illustrates in detail a portion 22a of memory array 22. Portion 22a includes six single field effect transistor floating gate memory cells 50, 52, 54, 56, 58, and 60. This type of memory cell is shown solely for illustration purposes. Other types of memory cells may also be programmed to multiple states using the present methods. For example, multiple transistor memory cells and memory cells that use a trapping dielectric to shift the threshold voltage of the memory cells may both be programmed using the present methods. Additionally, volatile memory cells, such as those used in DRAMs, could be programmed using the present methods.

Memory cells 50, 52, 54, 56, 58, and 60 are formed at the intersections of word lines 62 and 64 and bit lines 66, 68, and 70. Word lines 62 and 64 are also referred to as X lines or row lines. This is because each wordline is coupled to X decoder 28. Each wordline is also coupled to all memory cell gates in a particular row. For example, word line 62 is coupled to the gates of memory cells 50, 52, and 54. Bit lines 66, 68 and 70 are also referred to as Y lines or column lines because they are coupled to Y decoder 30. Each bitline is coupled to all memory cell drains in a particular column. For example, bitline 68 is coupled to the drains of memory cells 52 and 58. The sources of all memory cells in a row are coupled to a local source line. The sources of memory cells 50, 52 and 54 are coupled to local source line 72, while the sources of memory cells 56, 58 and 60 are coupled to local source line 74. Local source lines 72 and 74 are also coupled to common source line 76, which is coupled to voltage switch 38. Common source line 76 thus provides a mechanism for applying voltages to the sources of all memory cells within a block of memory array 22.

Together the bitlines, wordlines, and the common source line provide a means of applying to the memory cells the voltages necessary for programming, erasing, and reading memory cells within array 22. Memory cells 50, 52, 54, 56, 58 and 60 are erased via Fowler-Nordheim tunneling by applying approximately zero volts to memory cell gates via wordlines 62 and 64, allowing bitlines 66, 68 and 70 to float, and tying memory cell sources to approximately 12 volts via common source line 76. Memory cells 50, 52, 54, 56, 58, and 60 can also be erased via negative gate erase by applying −10 volts to memory cell gates, allowing the drains to float, and coupling the sources to 5 volts. Within flash memory arrays, an entire block of memory cells is erased at once. Memory cells are read, that is to say their states are sensed, by applying one to seven volts to wordlines 62 and 64, approximately one volt to bitlines 66, 68 and 70 and allowing common source line 76 to float. Memory cells 50, 52, 54, 56, 58, and 60 are programmed via hot electron injection by applying a source voltage $V_S$ to common source line 76, applying a drain voltage $V_D$ to bitlines 66, 68, and 70 such that the bitline voltage level is 5–7 volts above source line 76; i.e., setting $V_{DS}$ to 5–7 volts, and applying a voltage level to wordlines 62 and 64 sufficient to change the amount of charge stored by the memory cells being programmed. Other voltage levels also can be used to program memory cells. As used herein, "programming pulse" refers to the combination of voltages applied to the bitline, sourceline, and wordline of a memory cell to shift its threshold voltage by changing the amount of charge stored in the memory cell.

A group of memory cells are selected for programming and reading by coordinating the control of wordline and bitline voltages. To illustrate, assume that memory cell 50 is to be programmed. The gate voltage for memory cell 50 is brought to, and held at, the appropriate level via wordline 62, which also applies the same voltage to the gate of memory cells 52 and 54. Local source line 72 applies the same voltage to the sources of all three memory cells. Memory cell 50 is programmed by pulsing the voltage on its drain by pulsing the voltage on bitline 66, while bitlines 68 and 70 are held near ground and wordline 62 is held at a high enough voltage to develop a desired electric field across the gate oxide of memory cell 50. Thus, only memory cell 50 is programmed. The duration of a programming pulse within memory array 22 is controlled by the duration of the high voltage on the selected bitline, that is to say, by the drain voltage.

As stated previously, programming and erasure of a memory cell alters its threshold voltage and the drain current conducted by the memory cell during sensing. Possible threshold voltages in a nonvolatile memory cell range from a lower limit of approximately 1.5 volts to an upper limit of approximately 7.0 volts. The lower limit of the programming range, or programming window, is constrained by erase times and gate disturb voltages. The upper level of the programming window is constrained by drain disturb voltages and bake charge loss. The programming window permits nonvolatile memory cells to store more than one bit of data.

For memory cells storing more than one bit of data there is not a one to one correspondence between the number of memory cells within array 22 and the number of bits of data stored by array 22. Thus, the phrases "memory cell" and "bit" are not used synonymously herein. "Memory cell" refers to a physical device, such as a transistor illustrated in FIG. 3, and "bit" or "bits" refers to the logical data stored within a memory cell.

The number of bits, B, stored within a nonvolatile memory cell is related to the number of states, S, by the equation $S=2^B$, where B is not restricted to integer values. The number of states that could be stored within a nonvolatile memory cell is limited in practice by the ability to place states and to distinguish between those states at some later time. Thus, if the sensing circuitry can detect the difference of a single electron, then states may be defined in terms of a single electron. States may be defined in terms of memory cell threshold voltage level or drain current. Memory cell threshold voltage $V_t$, and drain current $I_D$ are approximately related to each other by the expression:

$$I_D \alpha G_m x (V_G - V_t) \text{ for } V_D > V_G - V_t$$

$G_m$ is the transconductance of the memory cell;
$V_G$ is the memory cell gate voltage;
$V_D$ is the memory cell drain voltage; and
$V_t$ is the memory cell threshold voltage.

For memory cells storing multiple bits of data, each of the possible patterns of bits represents one state. In effect, the cell is storing base S data, where S is the number of states the cell is capable of storing. The bit pattern results from decoding the state data of one or multiple cells. For example, for memory cells storing two bits of data there are four bit patterns: 00, 01, 10, and 11. Each of these bit patterns is represented by a state. The particular state represented by a particular pattern of bits depends upon the type of coding used. Two commonly used types of coding are Gray coding and binary coding. The type of coding used does not effect the present methods of programming.

States may be defined in a variety of ways. They may be defined in terms of a range of threshold voltages $V_t$, a range of drain currents $I_d$, or a range of charge.

II. Exact Placement Algorithms For Programming Multiple States

Figure 4A:
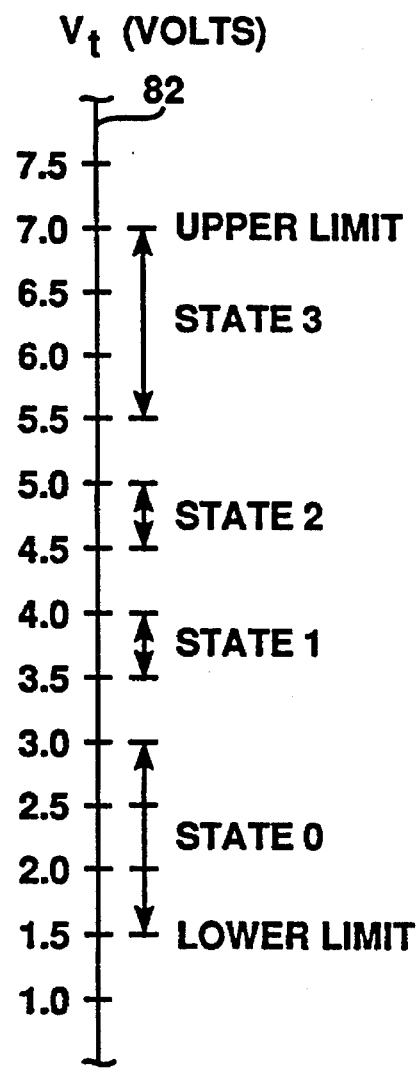
FIG. 4A illustrates four states defined by different threshold voltages of a nonvolatile memory cell.
Figure 4B:
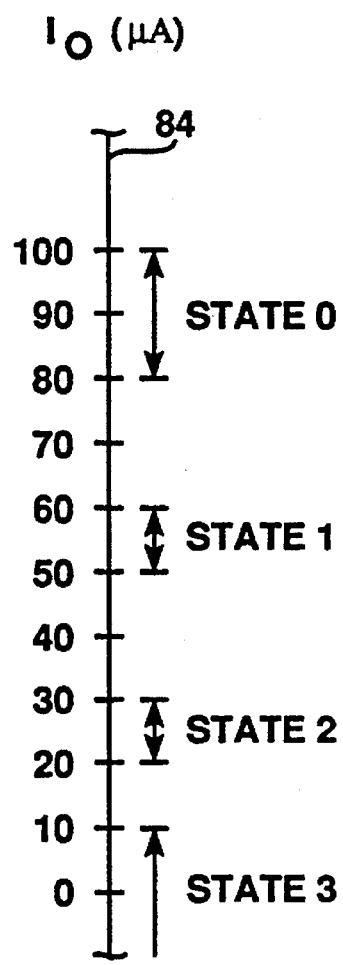
FIG. 4B illustrates four states defined by different drain currents of a nonvolatile memory cell.

Exact placement algorithms program each nonvolatile memory cell to a destination state that is defined by a range of threshold voltages $V_t$, or drain currents $I_d$ or an amount of charge. FIGS. 4A and 4B illustrate two definitions of four states for a nonvolatile memory cell storing 2 bits of data. According to the definition of FIG. 4A, states 0, 1, 2, and 3 each occupy a range of threshold voltages, $V_t$. The state representing the lowest threshold voltage, state 0, is achieved by erasing the memory cell. The other three states, states 1–3, are achieved by programming the memory cell. FIG. 4B defines four states in terms of ranges of drain current. The state representing the greatest amount of drain current, state 0, is achieved by erasing the memory cell. The other three states, states 1–3, are achieved by programming.

When exactly placing states, however defined, the designer may choose to program multiple memory cells in parallel; i.e., simultaneously, or to program each memory cell individually. Programming multiple cells in parallel regardless of their destination states requires using multiple program pulses to avoid overshooting states. In contrast, a single programming pulse may be used when memory cells are programmed independently of each other. Both methods of exact placement account for program variation caused by most sources of variation, such as $V_{PP}$ variation, temperature variation, and cell-to-cell variation. Additionally, exact placement methods of programming are robust.

Figure 5:
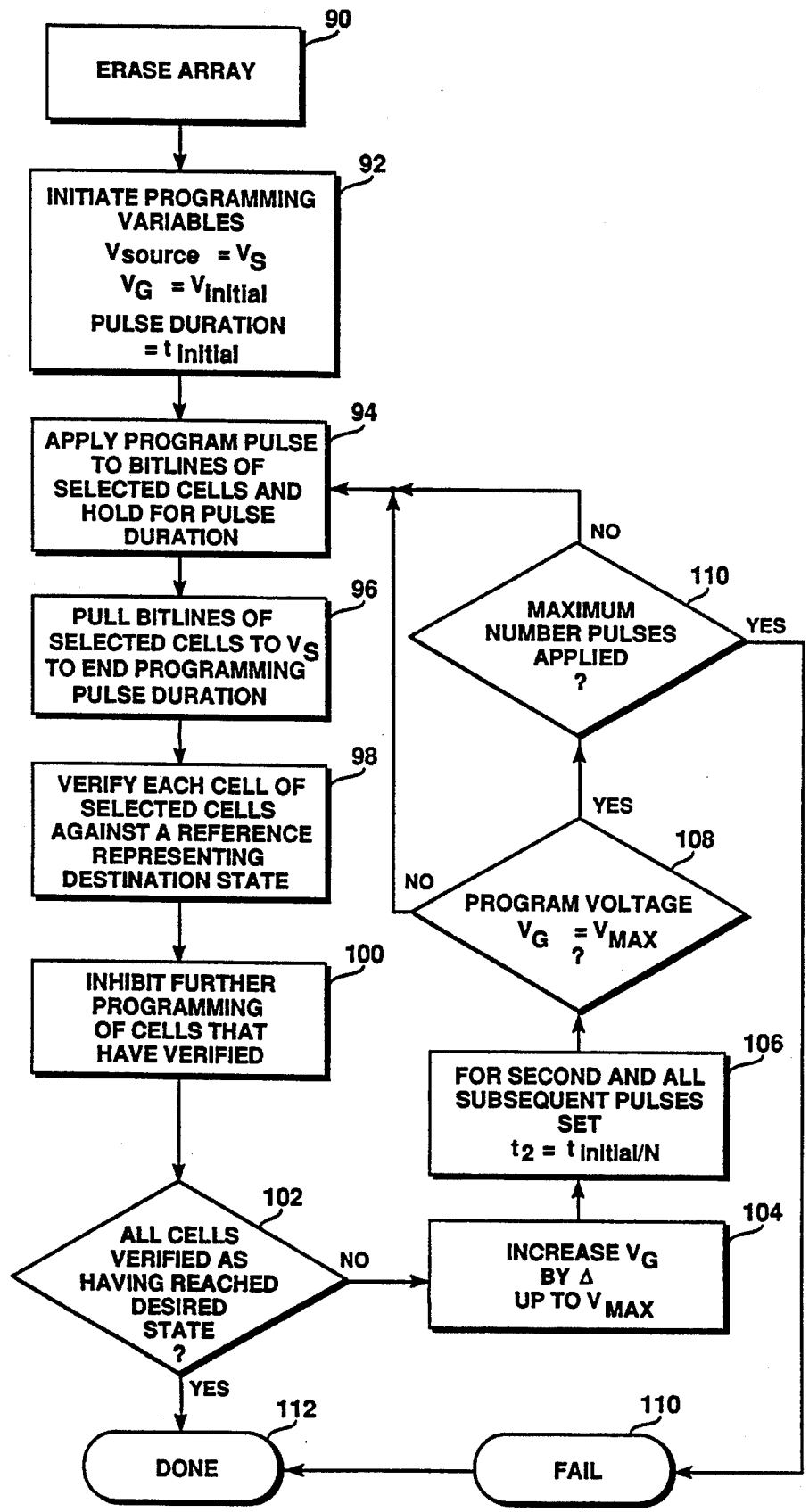
FIG. 5 is a flow diagram of a method of programming in parallel multiple memory cells.

A. Programming Multiple Nonvolatile Memory Cells in Parallel Using Exact Placement FIG. 5 illustrates in flow diagram form a method of programming a number of memory cells in parallel to multiple states representing a pattern of bits. The method illustrated programs memory cells as close as possible to predefined states, whether those states are defined in terms of drain current or threshold voltage. The following discussion deals with the programming of four states associated with two data bits; however, the method is equally applicable to storage of an arbitrary number of bits of data by a single memory cell.

Briefly described, according to the present method all memory cells within a selected group are programmed simultaneously, regardless of their destination states; i.e., regardless of the amount of charge to be placed in each memory cell. An initial programming pulse is applied to all memory cells in the selected group. Afterward, each memory cell within the selected group is program verified to determine whether it has been programmed to its destination state. As used herein, program verification refers to the process of determining whether a defined amount of charge has been placed in a memory cell. No additional programming pulses are applied to those memory cells that program verify. If any memory cell within the selected group did not program verify, the wordline voltage of the programming pulse is increased. Another programming pulse is then applied to those memory cells which did not verify. The process of programming, verifying, and increasing the gate voltage continues until all memory cells verify or a maximum gate voltage is reached.

Figure 6:
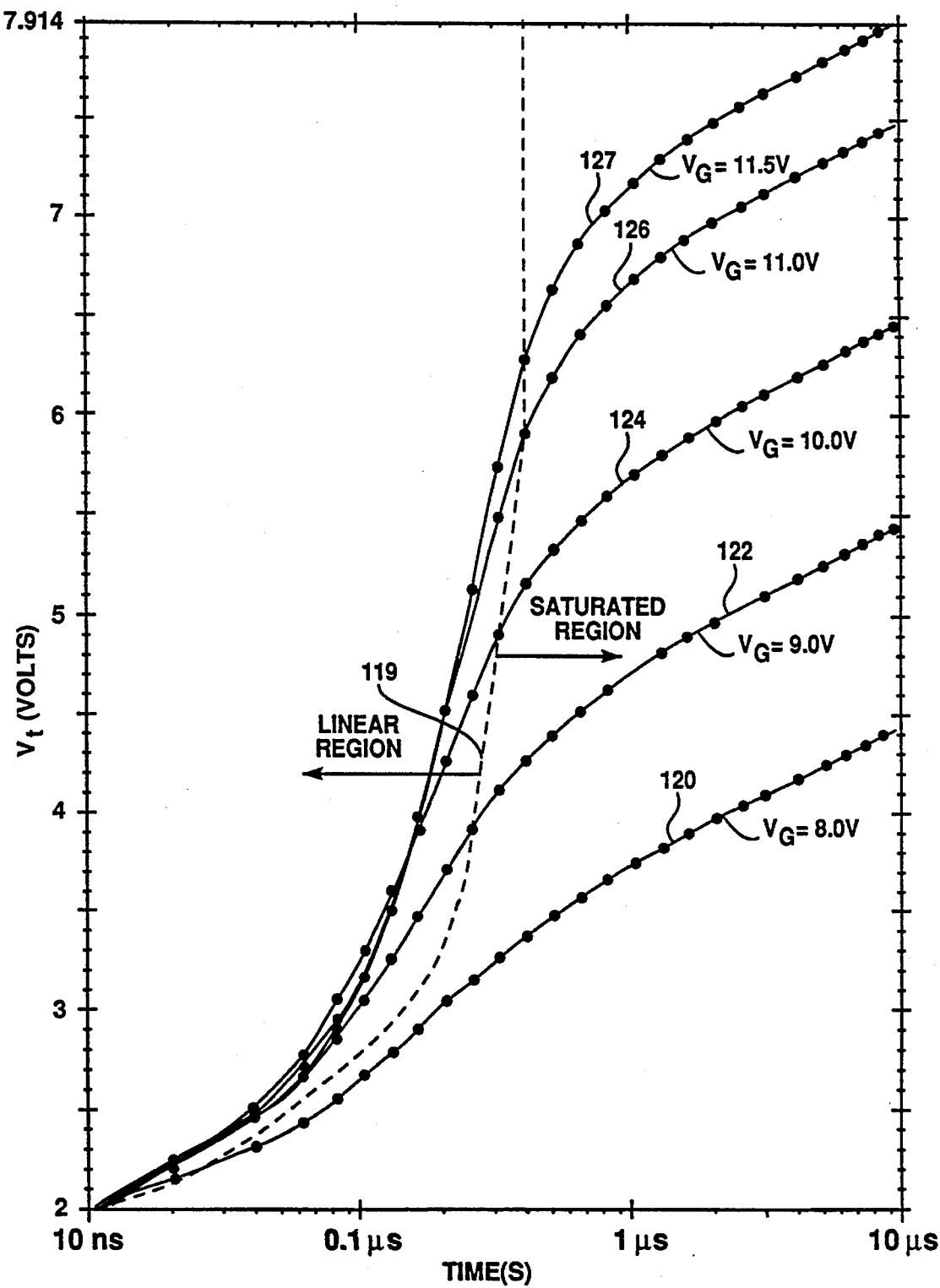
FIG. 6 graphs threshold voltage versus time for various gate voltages.

The programming method of FIG. 5 steps the wordline voltage of each subsequent programming pulse rather than increasing the total programming duration of each subsequent programming pulse. The rationale for this programming strategy arises from the programming characteristics of nonvolatile memory cells. FIG. 6 graphs memory coil threshold voltage $V_t$ versus the log of programming time for five different gate voltages during programming. The gate voltages are relevant as an indication of the relative strength of the electric field across the gate oxide of the memory cell. Increasing gate voltage increases the strength of this electric field during programming. Curve 120 illustrates $V_t$ versus time given a gate voltage of 8 volts. Curve 122 illustrates $V_t$ versus time for a gate voltage of 9 volts. Gate voltages of 10 volts and 11 volts results in curves 124 and 126, respectively. All four curves 120, 122, 124 and 126 show threshold voltage increasing exponentially in the linear region to the left of curve 119. (The linear region is so named because when threshold voltage is plotted on a linear time scale in this region threshold voltage increases linearly.) That is to say, in the region to the left of line 119 the threshold voltage increases greatly given a small increase in programming pulse duration. This behavior is characteristic of nonvolatile memory cells that use hot electron injection for programming. Precise control of $V_t$ is difficult when a memory cell is programmed in the linear region. Exact programming of a memory cell is easier in the saturated region of curves 120, 122, 124 and 126, which is to the right of curve 119. This is because in the saturated region, $V_t$ increases more slowly, nearly logarithmically, with time. When programmed in the saturated region, all nonvolatile memory cells exhibit this logarithmic increase in $V_t$ with increasing programming pulse duration regardless of whether they include a trapping dielectric or a floating gate, and regardless of the programming mechanism used.

Programming of memory cells while operating in the saturated region is slow if the gate voltage is maintained constant and total programming pulse duration is increased. For example, curve 120 shows that a programming pulse of nearly 10 μseconds duration is required to raise a memory cell's threshold voltage from 3 volts to 4 volts. Another 100 μseconds programming pulse would be required to raise the threshold voltage from 4 volts to 5 volts. In contrast, curves 120, 122, 124 and 126 reveal nearly a one volt increase in $V_t$ for each volt increase in the gate voltage when programming in the saturated region. As a result, memory cells can be more quickly programmed by increasing the gate voltage of each subsequent programming pulse than by maintaining a constant gate voltage and increasing total program pulse duration.

Figure 7:
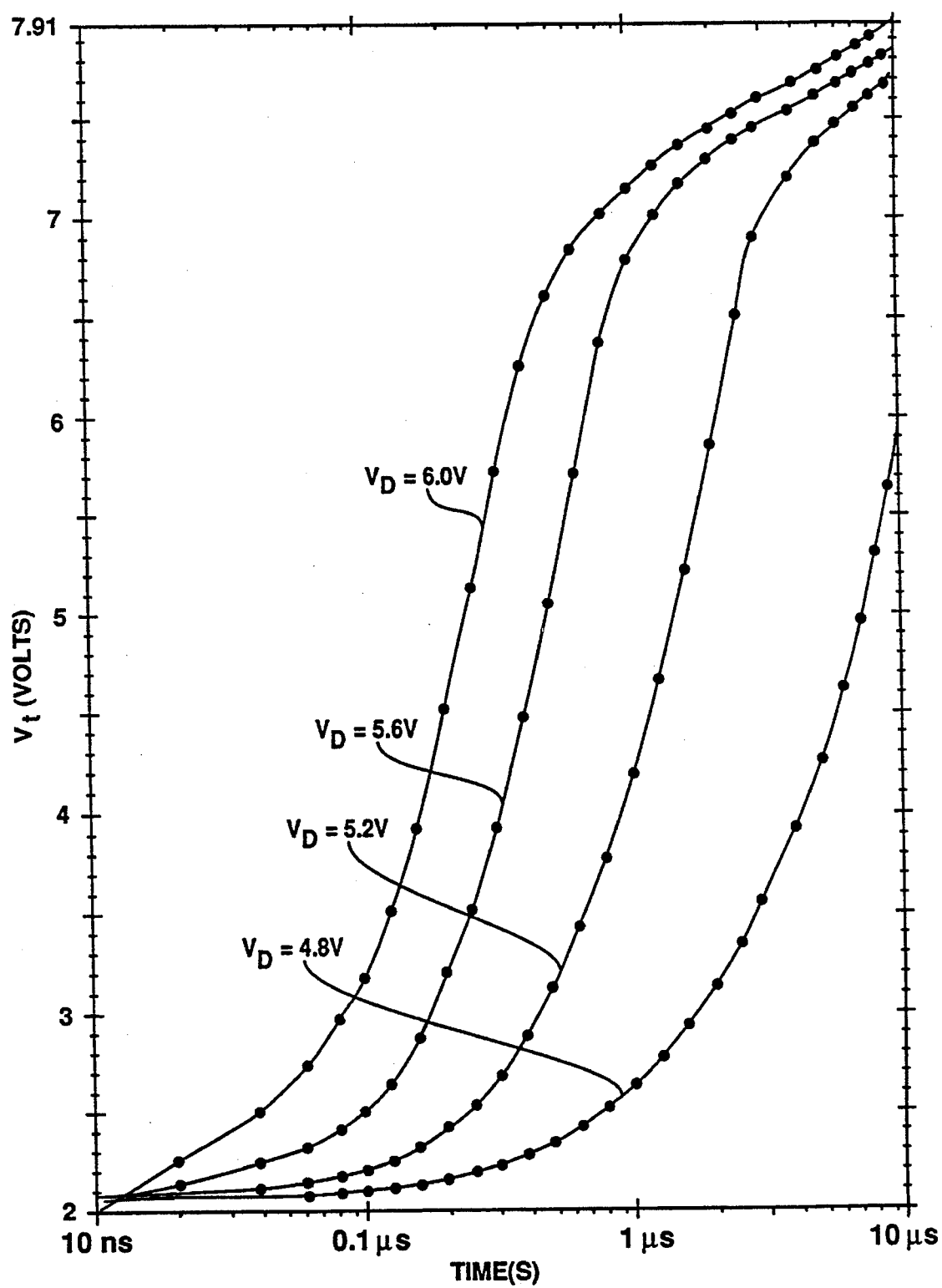
FIG. 7 graphs threshold voltage versus time for various drain voltages.

Precise control of memory cell programming via hot electron injection is achieved by choosing a sufficiently long initial pulse width, i.e. pulse duration, to ensure that programming occurs in the saturated region of the $V_t$ versus time curve. The duration of a sufficiently long initial pulse width varies from device to device because of process variations. Despite this variation, the same initial pulse width can be used to program all devices in the saturated region if each device is appropriately trimmed after manufacture. One trimming technique that works well is trimming of the drain bias voltage level used during programming. FIG. 7 illustrates $V_t$ versus time curves at various drain bias voltage levels for one effective channel length. Other effective channel lengths will have a different family of curves. These curves show that programming in the saturated region for a selected initial pulse width is simply a matter of selecting an appropriate drain bias voltage, that is to say, a drain bias voltage level that forces the selected time to cause programming to occur in the saturated region.

Figure 8:
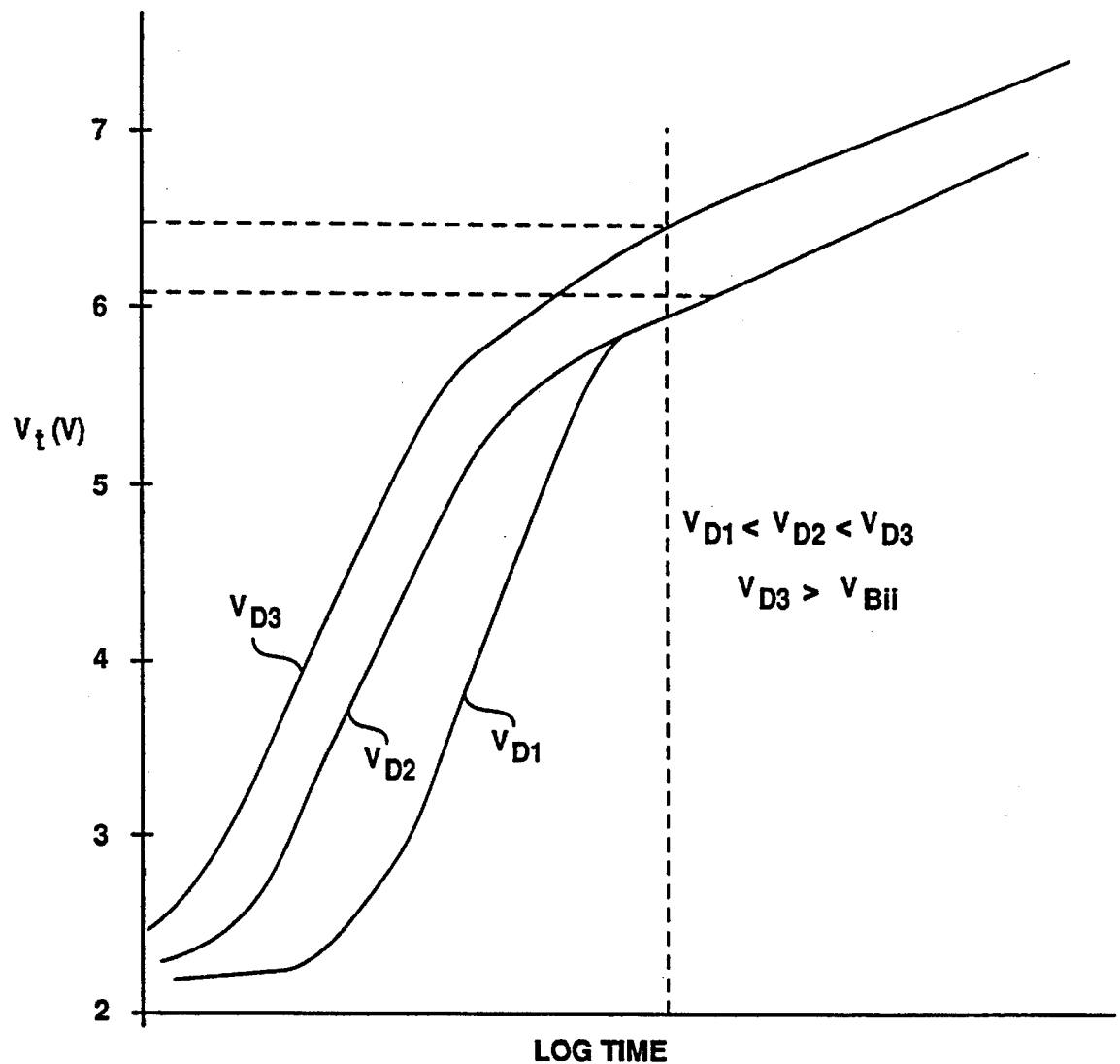
FIG. 8 graphs threshold voltage versus time for various drain voltages.

Impact ionization induced bipolar turn-on voltage $V_{Bii}$ limits the maximum drain bias voltage level that can be used while programming via hot electron injection. Turning on the parasitic bipolar transistor increases charge storage and makes precise placement of states difficult. FIG. 8 illustrates the effect of $V_{Bii}$ upon threshold voltage. For drain bias voltage levels less than $V_{Bii}$, increasing $V_D$ only effects the linear region of the $V_t$ versus time curve, as illustrated by the merging of curve for $V_{D2}$ into the curve for $V_{D1}$. Maximum threshold voltage levels in the saturated region am unaffected by increased drain bias voltage levels. This is no longer the case when the drain bias voltage is above $V_{Bii}$. The $V_t$ derived from a programming pulse of a constant duration at $V_{D3}$, with $V_{D3} > V_{Bii}$, will be greater than the $V_t$ derived using $V_{D1}$ and $V_{D2}$. For example, near $V_{Bii}$ a difference of 0.1 volt in $V_D$ can lead to a 0.2–0.25 volt difference in $V_t$.

Effective channel length, $L_{eff}$, effects the value of $V_{Bii}$. As the effective channel length increases, so does $V_{Bii}$. Effective channel length also effects the drain voltage at which the linear region transitions to the saturated region. Effective channel length varies as a result of the fabrication process. Thus, effective channel length, the voltage $V_{Bii}$, and the need to program within a reasonable time define a range of drain bias voltage levels appropriate for programming in the saturated region. Devices may be trimmed after manufacture to program within this saturated region for a given minimum pulse duration. In one embodiment of flash memory device 20, acceptable values of the drain bias voltage range between 5.0 volts to 6.6 volts. Selecting an appropriate drain bias voltage level within this range requires characterization of effective channel lengths within a memory array during son, subsequent to fabrication.

Given this explanation of memory cell programming behavior, now consider in detail the method of programming illustrated in FIG. 5. Control engine 36 preferably begins by erasing memory array 22. This is because regardless of the number of bits stored by each memory cell, state 0 is achieved by erasure of the memory cell. Within flash memory arrays, all memory cells within a block are erased simultaneously. Stated another way, flash memory cells cannot be erased individually. It is possible, however, to program memory cells without prior erasure. Afterward, control engine 36 branches to step 92.

Control engine 36 prepares to program memory cells to states other than state 0 by initializing program variables in step 92. Control engine 36 sets the gate voltages of the memory cells to an initial programming level. The initial programming gate voltage level chosen depends upon the number of bits to be stored by each memory cell and the need to avoid overshooting the state immediately adjacent state 0. The source voltage is set to an initial value, such as ground, for example. During step 92 control engine 36 also sets the initial program pulse duration such that programming occurs within the saturated region. The drain bias voltage level to be used during programming has previously been trimmed to ensure that programming will occur in the saturated region given the initial pulse duration. For example, in one embodiment the initial programming pulse is 4 μseconds. This done, control engine 36 branches to step 94.

Under the control of control engine 36, during step 94 a programming pulse is applied to all memory cells within the selected group, regardless of the state to which the memory cells are to be programmed. Control engine 36 does so by bringing the drain voltages $V_D$ of the selected group of memory cells to a voltage level such that $V_{DS} = 5–7$ volts. Memory cells that are not to be programmed are protected from programming by coupling their bitlines to the source voltage level $V_S$ so that $V_{DS} = 0$. In one embodiment, $V_S = 0–3$ volts.

The maximum size of the selected group of memory cells programmed at one time depends on a number of factors, and does not effect the present method of programming.

Control engine 36 stops the programming of the selected memory cells at step 96 by bringing the bitlines of the selected memory cells to $V_S$; i.e., setting $V_{DS}$ to 0 volts. Thus, it will be understood that the time duration of the programming pulse is controlled by the length of time $V_{DS}$=5–7 volts.

To illustrate the effect of steps 92–96, assume that the selected group of memory cells includes memory cells 50, 52, and 54 of FIG. 3. Assume further that memory cell 50 is to be programmed to state 0, memory cell 52 to state 1, and that state 3 is the destination state of memory cell 54. During step 92 common source line 76 is coupled to $V_S$. $V_S$ may range between 0–3 volts. Word line 62 is coupled to the initial gate voltage level because it is coupled to the selected group of memory cells; e.g., cells 50, 52, and 54. In contrast, wordline 64 is coupled to $V_S$. Bitlines 66, 68, and 70 are coupled to $V_S$ during step 92, thereby preventing programming of memory cells 50, 52 and 54 because $V_{DS}$=0 volts. Control engine 36 brings bitlines 68 and 70 up to 5–7 volts above $V_S$ during step 94, programming memory cells 52 and 54 simultaneously. After the period of time selected for the initial programming pulse has elapsed, control engine 36 ends the programming pulse at step 96 by bringing the voltage level coupled bitlines 68 and 70 to $V_S$.

Control engine 36 determines the success of the programming operation at step 98 via program verification. If a memory cell has reached its destination state, it is said to have verified. Conversely, if a memory cell has not yet been programmed to its destination state (as indicated by its drain current), then the memory cell is said to not have verified, or to have failed verification. During verification, each memory cell is compared to a reference representative of a destination state. For example, memory cell 52 is compared to a reference representative of state 1 and memory cell 54 is compared to a reference representative of state 3. Memory cell 52 will verify if its threshold voltage, drain current, or amount of current represents state 1, while memory cell 54 will verify if its threshold voltage, drain current, or amount of charge represents state 3. As a result of step 98, control engine 36 will receive a group of verify signals, one for each memory cell verified.

Verification complete, control engine 36 branches from step 98 to step 100. At step 100, control engine 36 inhibits further programming of memory cells that verified. Control engine 36 does so by coupling the bitlines associated with the verified memory cells to $V_S$ prior to, and during, any subsequent programming pules. Other mechanisms of inhibiting further programming of verified cells will be appropriate for array architectures differing from that of memory array 22. The particular mechanism for inhibiting further programming of cells that have reached their destination state does not effect the present method of programming. This done, control engine 36 branches to step 102.

Control engine 36 determines at step 102 if any further programming pulses should be applied to memory array 22. This determination is based upon examination of the verification signals. If any of these signal indicate that a memory cell has not yet been programmed to its destination state, then another programming pulse should be applied to memory array 22. Control engine 36 responds by branching to step 104.

Figure 9:
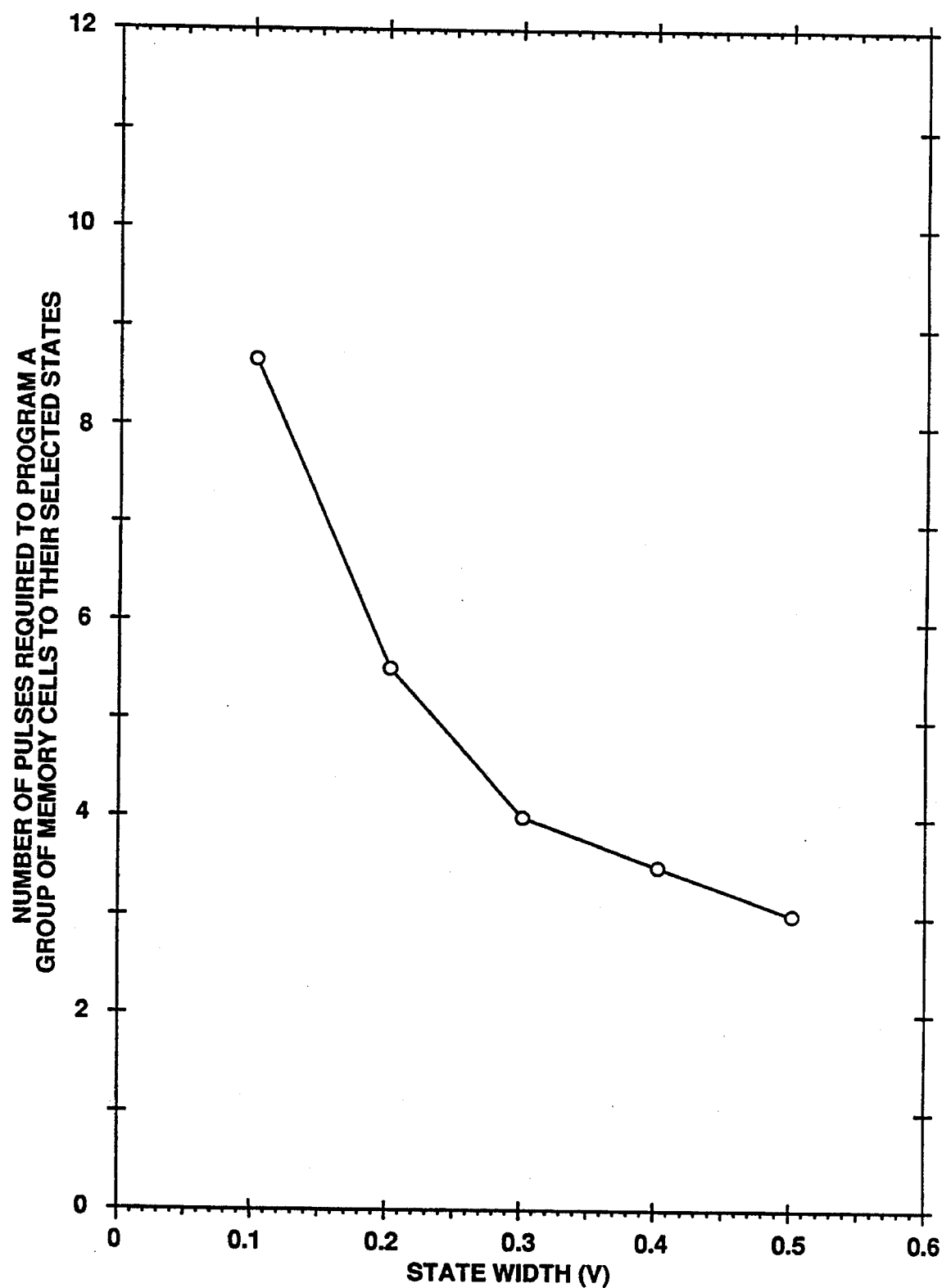
FIG. 9 illustrates the number of programming pulses required to program a group of memory cells versus state width.

Control engine 36 increases the voltage applied to memory cell gates by some amount, during step 104. Let us call that amount the "step size." The choice of step size depends upon the initial gate voltage, state width, and the need to prevent overshooting states. As used herein, "state width" refers to the range of drain currents, threshold voltages, or amount of charge defining a state. Larger state widths permit larger step size and thus require fewer programming pulses to program memory cells to the various states. To illustrate, consider FIG. 9, which graphs the number of programming pulses required to program a group of memory cells in parallel versus state width. FIG. 9 shows that the number of programming pulses required to program a group of multilevel memory cells decreases as state width increases.

In any case, control engine 36 increases the gate voltage by a step size up to a maximum, $V_{max}$, at step 104. The maximum gate voltage is low enough to prevent damaging the memory cell and varies depending upon the process by which the memory cells are fabricated and the resulting strength of the electric field across the memory cell gate oxide. That done, control engine 36 branches to step 106.

During step 106, control engine 36 sets the time duration of the second and all subsequent programming pulses. Control engine 36 reduces the time duration of all subsequent pulses as compared to the time duration of the initial programming pulse to reduce the change in threshold voltage and drain current caused by increased total programming time, which could lead to overshooting states. The increase in threshold voltage from one programming pulse to the next arises from an increase in gate voltage and an increase in total program duration. To illustrate, assume that an initial programming pulse of 1 μseconds at a gate voltage of 8 volts is applied to a memory cell and a second programming pulse is applied, which is one μsecond in duration and has a gate voltage of 8.2 volts. Referring to FIG. 6, the threshold voltage after the first programming pulse is 3.6 volts. An additional 1 μsecond of programming at a gate voltage of 8 volts would increase $V_t$ by approximately 0.25 volts and an additional 0.2 volt on the gate should increase $V_t$ by only 0.2 volt. Thus, $V_t$ would be increased by a total of 0.45 volts to 4.05 volts after the second programming pulse.

The relationship between the program pulse duration of all subsequent pulses to the initial pulse can be expressed mathematically as:

$$t_s = t_i/M$$

where:

$t_s$ denotes the time duration of all pulses subsequent to the initial pulse;

$t_i$ denotes the time duration of the initial programming pulse; and

M is the ratio of the duration of subsequent programming pulses to the duration of the initial programming pulse.

Selecting the ratio, M, is a function of the state width and gate voltage step size. In general, a large state width allows a large step size, which results in a small ratio M. Analogously, a small state width requires a small step size and a larger ratio M. Stated another way, to avoid overshooting states when using a large state width and large step size, the time duration of each subsequent pulse need not be greatly reduced. However, when the state width and gate voltage step size are small, the time duration of the subsequent programming pulses should be decreased rapidly to avoid overshooting states.

For another embodiment, during step 106 control engine 36 may reduce the duration of each subsequent program pulse as compared to the duration of the immediately preceding program pulse.

After control engine 36 has reduced and set the program pulse duration of subsequent programming pulses, control engine 36 branches to step 108. During step 108, control engine 36 examines the gate voltage level used during programming. If the gate voltage has reached a maximum value $V_{MAX}$ and every memory cell within the selected group has not verified, then control engine 36 branches to step 110.

If the maximum gate voltage has not been reached, control engine 36 branches from step 108 to step 94 to apply another programming pulse to the selected group.

So long as a maximum number of pulses have not been applied, control engine 36 branches through steps 94–110, applying programming pulses until all memory cells have been programmed to their destination states. When that occurs, control engine 36 branches from step 102 to step 112 and programming is complete.

Once the gate voltage has reached its maximum value $V_{MAX}$, control engine 36 branches from step 108 to step 110. Step 110 permits control engine 36 to continue applying programming pulses even after the gate voltage has reached its maximum value until a maximum number of pulses have been applied. That maximum number is a design choice. Once the maximum number of pulses have been applied without successfully programming the selected group, control engine 36 branches from step 110 to step 111.

Control engine 36 notes the failure of the programming operation during step 111. Control engine 36 then branches to step 112, and the programming operation is over.

Figure 10:
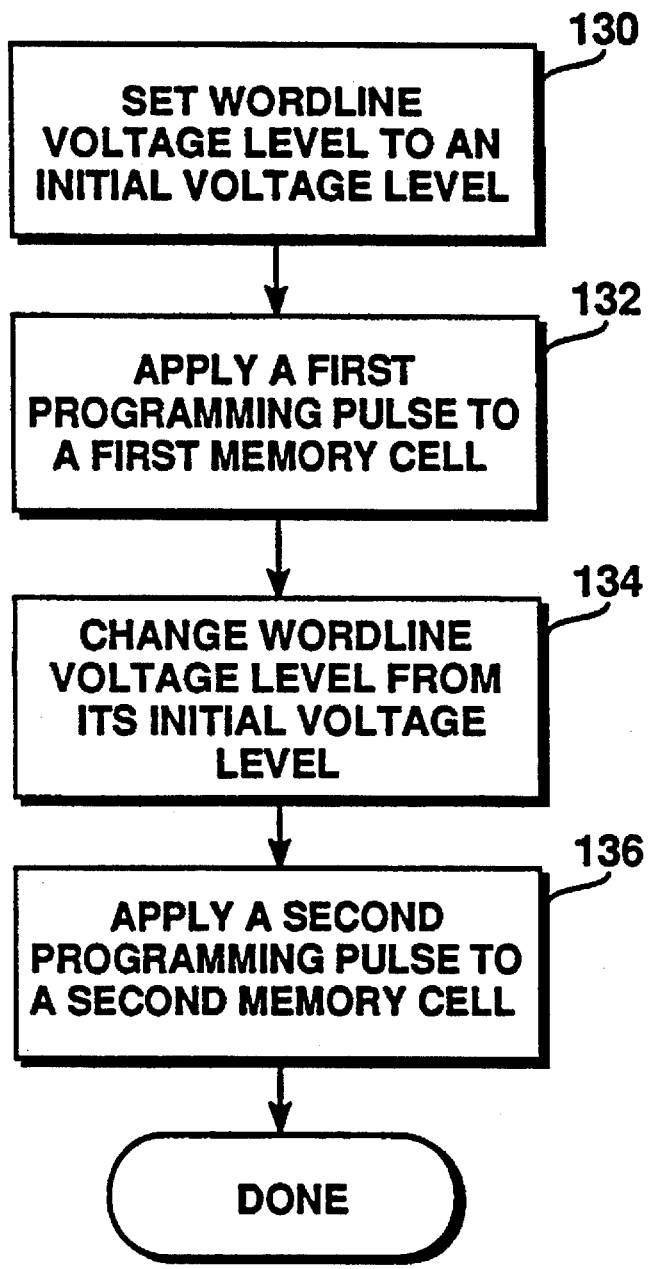
FIG. 10 is a flow diagram of a method of individually programming memory cells to store differing amounts of charge.

B. Programming Multiple Nonvolatile Memory Cells Independently Using Exact Placement FIG. 10 illustrates in flow diagram form a method of independently placing states in two memory cells. Stated another way, FIG. 10 illustrates a method of programming multiple memory cells to different well-defined states independently of each other. For clarity, FIG. 10 illustrates the programming of only two memory cells. Expansion of the method to larger number of memory cells will be apparent to one of ordinary skill in the art.

Programming begins during step 130 by selecting an initial voltage level to be applied to the gate, or wordline, of the first memory cell to be programmed. The initial wordline voltage level is selected such that the first memory cell will store the desired amount of charge representative of the first memory cell's destination state. That state may be defined in terms of a range of threshold voltages $V_t$, drain currents $I_d$, or amount of charge as discussed previously.

The initial wordline voltage chosen, a programming pulse is applied to the first memory cell. This is shown as step 132 in FIG. 10. This done, control engine 36 branches to step 134.

Control engine 36 adjusts the wordline voltage level in step 134 to a level that will place the amount of charge desired within the next, or second, memory cell. Varying the wordline voltage level during programming thus provides a mechanism for placing differing discrete amounts of charge within memory cells.

Control engines 36 then applies a programming pulse to the second memory cell during step 136 using the wordline voltage level selected during step 134.

C. Program Verification of Nonvolatile Memory Cells Storing Multiple Bits That Have Been Exactly Placed Up to this point sensing of data stored in a memory cell storing multiple bits and verification of that data have been described in general terms. They will now be discussed in greater detail because these processes are affected by the increase in the number of bits of data stored in a single memory cell.

Figure 11:
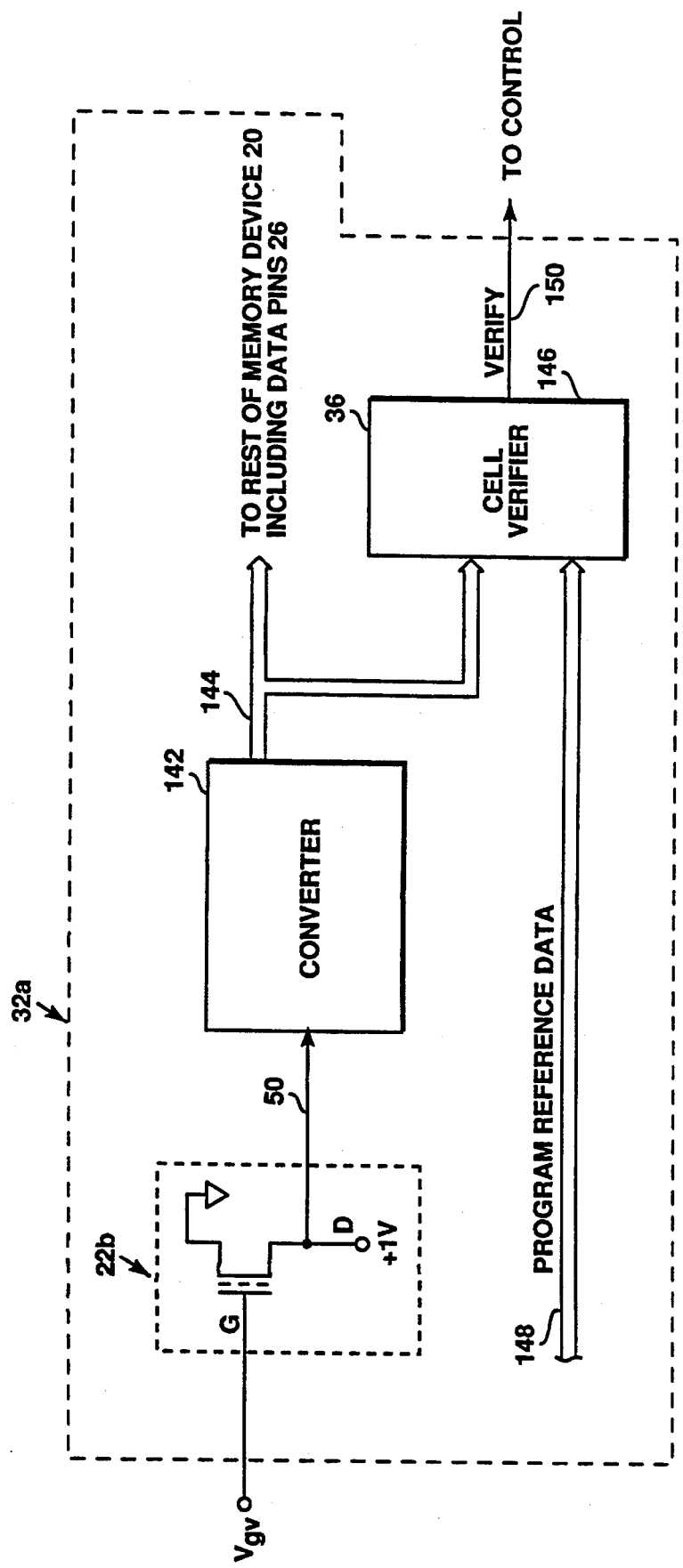
FIG. 11 is a block diagram of a circuit for sensing and verifying the programming of a memory cell storing multiple bits of data.

FIG. 11 illustrates in block diagram form circuit 32a, which is part of sensing circuitry 32. Circuit 32a senses and verifies the data stored in one nonvolatile memory cell storing multiple bits of data. Circuit 32a also controls the drain voltage applied to memory cell 22b during programming. The number of circuits 32a within sensing circuitry 32 determines the width of sensing circuit 32, and the number of memory cells that can be simultaneously read, programmed or verified.

Data stored within a memory cell of memory array 22, such as memory cell 22b, is sensed by applying a verify voltage to the cell gate, coupling approximately 1 volt to the drain, and coupling the source to ground, as is the common practice. Under these conditions, a current flows through the drain of memory cell 22b that is indicative of the threshold voltage of memory cell 22b and of the state to which memory cell 22b has been programmed. The drain of memory cell 22b is coupled to converter 142 to convert the state information of memory cell 22b into a bit pattern. The number of bits included in bit data 144 depends upon the number of states S memory cell 22b is capable of storing under the programming regime. The bit data 144 output from converter 142 is coupled to the rest of memory device 20 and to data pins 26.

The bit data 144 output from converter 142 is also coupled to cell verifier 146. Cell verifier 146 compares bit data 144 to the data that the external user wishes memory cell 22b to store. This data, program reference data 148 is stored in a data buffer, as is the common practice. Cell verifier 146 compares the data stored by memory cell 22b, represented by bit data 144, to program reference data 148. If bit data 144 matches program reference data 148, then cell verifier 146 brings VERIFY signal 150 active, indicating that memory cell 22b has been successfully programmed to the desired state. Conversely, if bit data 144 is not the same as program reference data 148, then cell verifier 146 brings VERIFY 150 inactive, indicating to control engine 36 that memory cell 22b has not been programmed to the desired state.

Thus, methods and circuitry for programming nonvolatile memory cells have been described that place discrete amounts of charge in a single nonvolatile memory cell. Control of the wordline voltage level during programming controls the amount of charge placed in the memory cell. This allows multiple states to be defined in terms of charge amount, where each state represents a pattern of data bits. Thus, the method and circuitry described permit storage multiple bits of data in a single memory cell.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A memory device comprising:
  a) a memory array including a first memory cell and a second memory cell, the first and second memory cells each storing discrete amounts of charge; and
  b) programming circuitry for programming the first memory cell to a first discrete amount of charge by applying a first programming pulse having a first programming voltage to the first memory cell and programming the second memory cell to a second discrete amount of charge by applying a second programming pulse having a second programming voltage level to the second memory cell, the second programming voltage level differing from the first programming voltage level, wherein each of the first and second programming pulses has sufficient duration to cause programming to occur in a saturation region.

2. The method of claim 1, wherein the memory array is volatile.

3. The method of claim 1, wherein the memory array is nonvolatile.

4. The memory device of claim 1, wherein the memory array further includes:

a) a first bitline coupled to the first memory cell; and b) a first wordline coupled to the first memory cell.

5. The memory device of claim 4 wherein the programming circuitry includes:

a) circuitry for coupling the first programming voltage to the first wordline and a second voltage to the first bitline.

6. The memory device of claim 5, wherein the first wordline is coupled to a gate of the first memory cell.

7. The memory device of claim 5, wherein the first bitline is coupled to a drain of the first memory cell.

8. A memory device comprising:

a) a memory array including a first memory cell and a second memory cell, the first and second memory cells each storing discrete amounts of charge; and b) a control engine for programming of the first memory cell to a first range of charge and the second memory cell to a second range of charge by applying a first programming pulse having a first programming voltage level to the first memory cell and by applying a second programming pulse having a second programming voltage level to the second memory cell, the second programming voltage level being different than the first programming voltage level, wherein each of the first and second programming pulses has sufficient duration to cause programming to occur in a saturation region.

9. The memory device of claim 8 further comprising:

c) sensing and verification circuitry coupled to the nonvolatile memory array for generating a first verify signal and a second verify signal, the first verify signal indicating whether the first memory cell has been programmed within the first range of charge, the second verify signal indicating whether the second memory cell has been programmed within the second range of charge; and wherein in response to the first verify signal indicating that the first memory cell has not been programmed within the first range of charge the control engine increases the first programming voltage level and applies again the first programming pulse to the first memory cell and wherein in response to the second verify signal indicating that the second memory cell has not been programmed within the second range of charge the control engine increases the second programming voltage level and applies again the second programming pulse to the second memory cell.

* * * * *

UNITED STATES PATENT AND TRADEMARK OFFICE
CERTIFICATE OF CORRECTION

PATENT NO. : 5,566,125
DATED : October 15, 1996
INVENTOR(S) : Fazio et al.

It is certified that error appears in the above-indentified patent and that said Letters Patent is hereby corrected as shown below:

In column 6 at line 64 delete "coil" and insert --cell--

In column 8 at line 25 delete "son" and insert --sort--

Signed and Sealed this

Twenty-first Day of January, 1997

Attest:

BRUCE LEHMAN

*Attesting Officer*  *Commissioner of Patents and Trademarks*